(12) United States Patent
Gambino et al.

(10) Patent No.: US 8,119,522 B1
(45) Date of Patent: Feb. 21, 2012

(54) METHOD OF FABRICATING DAMASCENE STRUCTURES

(75) Inventors: Jeffrey P. Gambino, Westford, VT (US); Peter J. Lindgren, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/941,184

(22) Filed: Nov. 8, 2010

(51) Int. Cl.
*H01L 21/4763* (2006.01)

(52) U.S. Cl. ............ 438/633; 257/E21.579; 438/618

(58) Field of Classification Search ............ 438/633
See application file for complete search history.

(56) References Cited

U.S. PATENT DOCUMENTS

| | | | |
|---|---|---|---|
| 5,343,052 | A | 8/1994 | Oohata et al. |
| 5,920,111 | A | 7/1999 | Wong et al. |
| 5,986,324 | A | 11/1999 | Adlerstein et al. |
| 6,281,135 | B1 | 8/2001 | Han et al. |
| 6,426,304 | B1 | 7/2002 | Chien et al. |
| 6,630,406 | B2 | 10/2003 | Waldfried et al. |
| 6,638,875 | B2 | 10/2003 | Han et al. |
| 6,943,387 | B2 | 9/2005 | Ohbu et al. |
| 6,958,294 | B2 | 10/2005 | Smith et al. |
| 7,202,176 | B1 | 4/2007 | Goto et al. |
| 7,387,968 | B2 | 6/2008 | Joe |
| 2005/0277277 | A1* | 12/2005 | Liu et al. .......... 438/597 |
| 2006/0170004 | A1 | 8/2006 | Toyoda et al. |
| 2006/0253097 | A1 | 11/2006 | Braig et al. |
| 2007/0105301 | A1 | 5/2007 | Chen et al. |
| 2008/0067631 | A1 | 3/2008 | Chidambarrao et al. |
| 2008/0079066 | A1 | 4/2008 | Hamaguchi et al. |
| 2009/0121353 | A1* | 5/2009 | Ramappa et al. .......... 257/751 |
| 2009/0314743 | A1* | 12/2009 | Ma ............... 216/51 |
| 2010/0078825 | A1* | 4/2010 | Patz et al. .......... 257/774 |
| 2010/0164116 | A1* | 7/2010 | Li et al. .......... 257/774 |
| 2010/0178771 | A1* | 7/2010 | Oh et al. .......... 438/700 |

FOREIGN PATENT DOCUMENTS

| | | |
|---|---|---|
| JP | 5048078 | 2/1993 |
| JP | 2004281837 | 10/2004 |
| JP | 92005223465 | 8/2005 |

* cited by examiner

*Primary Examiner* — Thao P. Le
(74) *Attorney, Agent, or Firm* — Schmeiser, Olsen & Watts; Richard Kotulak

(57) ABSTRACT

Method of forming wires in integrated circuits. The methods include forming a wire in a first dielectric layer on a substrate; forming a dielectric barrier layer over the wire and the first dielectric layer; forming a second dielectric layer over the barrier layer; forming one or more patterned photoresist layers over the second dielectric layer; performing a reactive ion etch to etch a trench through the second dielectric layer and not through the barrier layer; performing a second reactive ion etch to extend the trench through the barrier layer; and after performing the second reaction ion etch, removing the one or more patterned photoresist layers, a last formed patterned photoresist layer removed using a reducing plasma or a non-oxidizing plasma. The methods include forming wires by similar methods to a metal-insulator-metal capacitor.

17 Claims, 9 Drawing Sheets

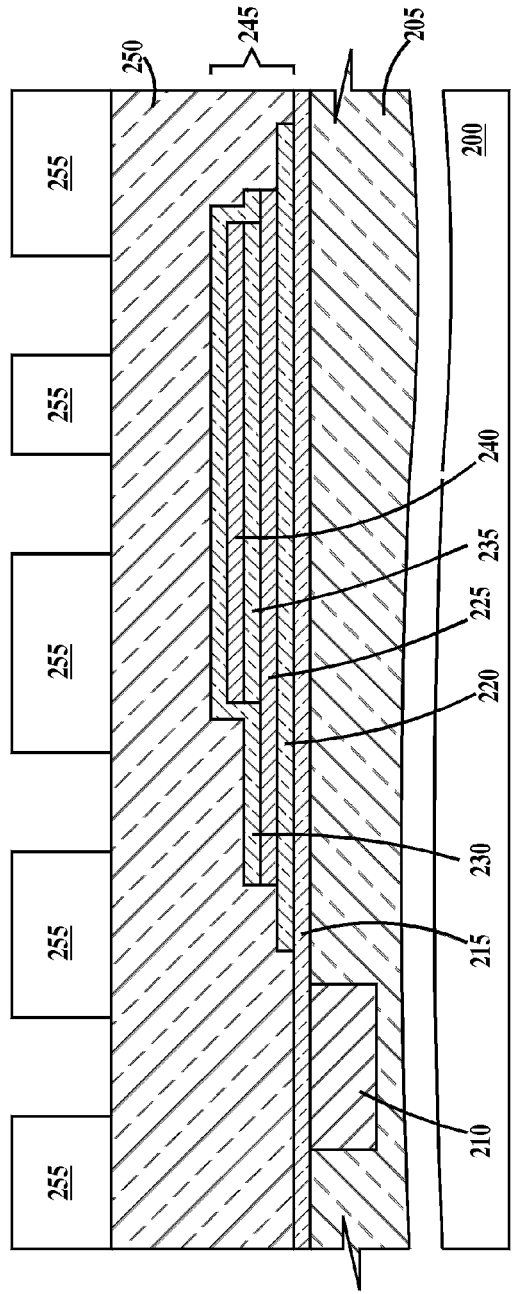
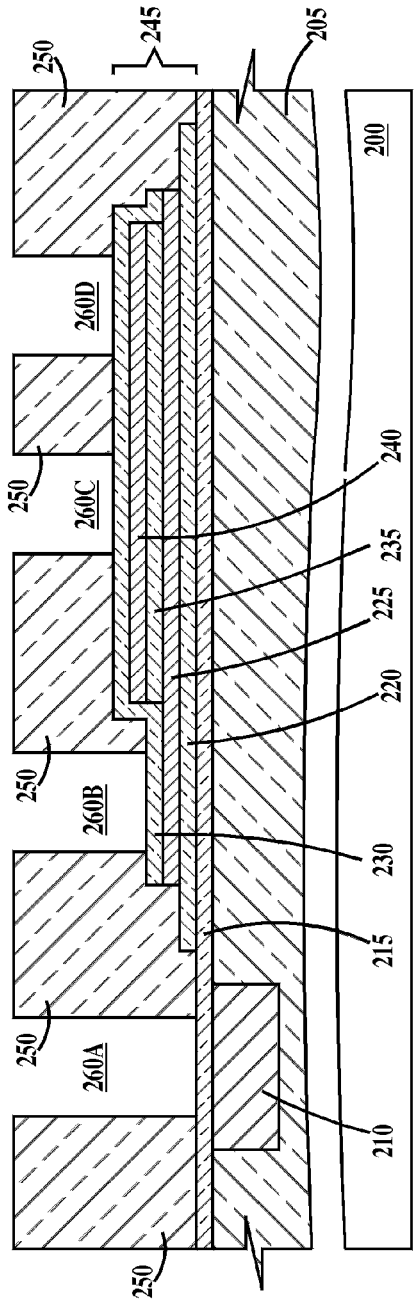
FIG. 4A
FIG. 4B

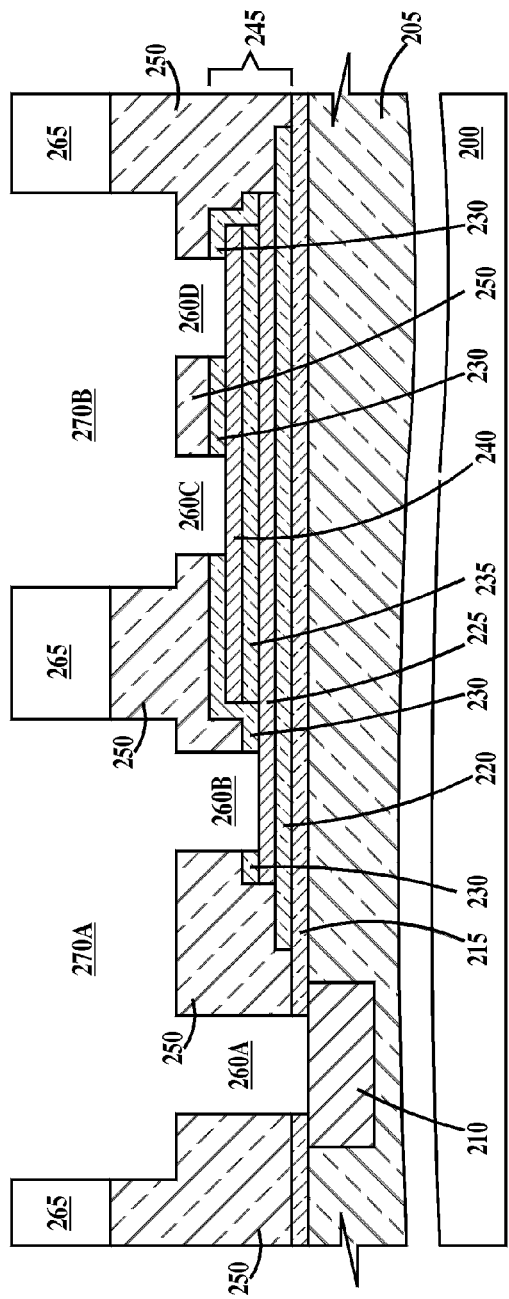
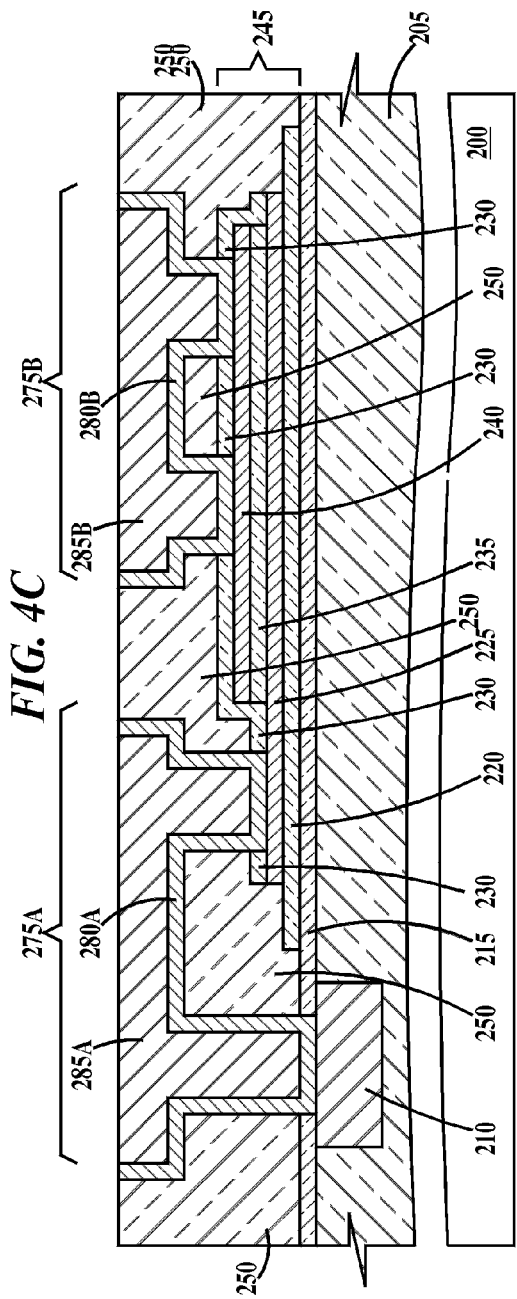
FIG. 4C
FIG. 4D

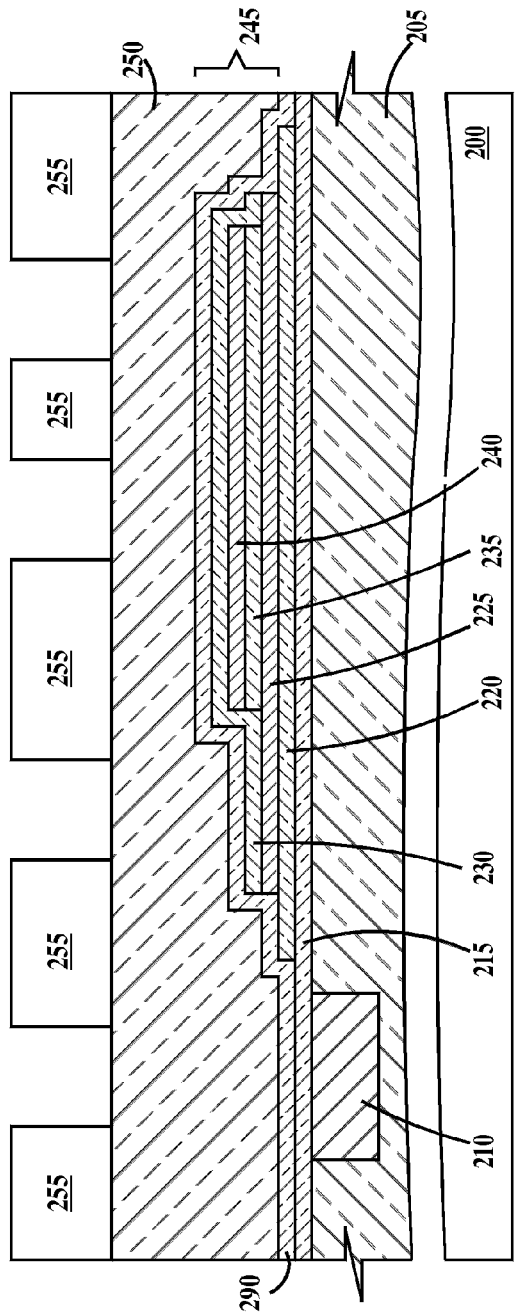
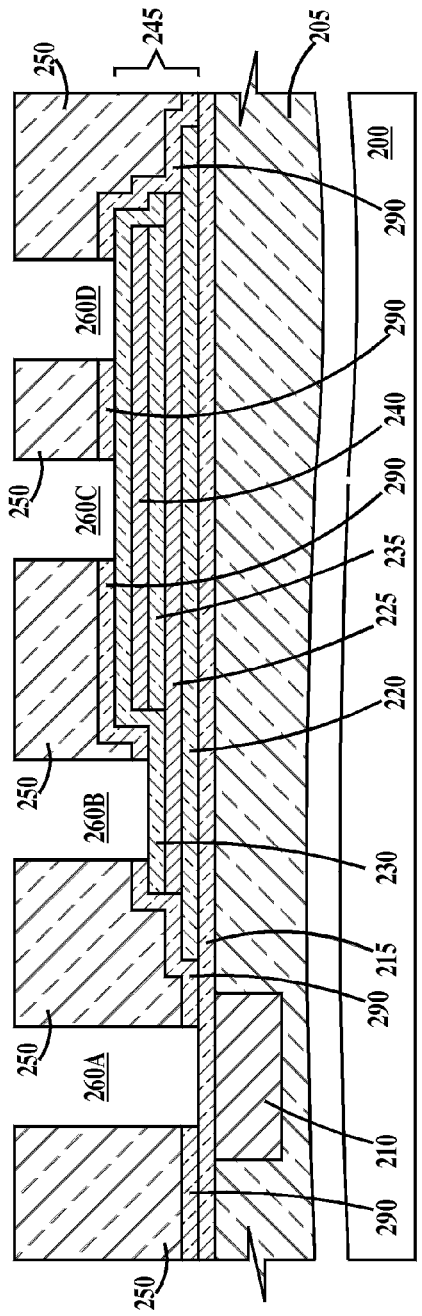
FIG. 5A
FIG. 5B

METHOD OF FABRICATING DAMASCENE STRUCTURES

FIELD OF THE INVENTION

The present invention relates to the field of integrated circuit manufacture; more specifically, it relates to methods of fabricating damascene wires and contacts, dual-damascene wires, and dual-damascene connections to metal-insulator-metal capacitors.

BACKGROUND OF THE INVENTION

As feature dimensions and the thickness of dielectric and metal layers in the wiring levels of integrated circuits has decreased, present damascene and dual-damascene processing has been shown to cause damage to underlying structures and adversely effect the geometry of the resultant damascene and dual-damascene wires and contacts resulting in reduced process windows and productivity. Accordingly, there exists a need in the art to mitigate or eliminate the deficiencies and limitations described hereinabove.

SUMMARY OF THE INVENTION

A first aspect of the present invention is a method, comprising: (a) forming wire in a first dielectric layer on a substrate; after (a), (b) forming a dielectric barrier layer over the wire and the first dielectric layer; after (b), (c) forming a second dielectric layer over the barrier layer; after (c), (d) forming a patterned photoresist layer over the second dielectric layer; after (d), (e) performing a first reactive ion etch to etch a trench through the second dielectric layer and not through the barrier layer; after (e), (f) performing a second reactive ion etch to extend the trench through the barrier layer; and after (f), (g) removing the patterned photoresist layer using a reducing plasma or a non-oxidizing plasma.

A second aspect of the present invention is a method, comprising: (a) forming a wire in a first dielectric layer on a substrate; (b) forming a dielectric barrier layer over the wire and the first dielectric layer; (c) forming a second dielectric layer over the barrier layer; after (c), (d) forming a first patterned photoresist layer over the second dielectric layer; after (d), (e) performing a first reactive ion etch to etch a first trench in the second dielectric layer; after (e), (f) removing the first patterned photoresist layer using a plasma; after (f), (g) forming a second patterned photoresist layer over the second dielectric layer; after (g), (h) performing a second reactive ion etch to etch a second trench in the second dielectric layer, the first and second trenches open to each other, regions of the barrier layer exposed by the first and second trenches; after (h), (i) performing a third reactive ion etch to remove the barrier layer exposed by the first and second trenches; and after (i), (j) removing the second patterned photoresist layer using a reducing plasma or a non-oxidizing plasma.

A third aspect of the present invention is a method, comprising: (a) forming a first wire in a first dielectric layer on a substrate and forming a barrier layer over a first wire and first dielectric layer; after (a), (b) forming a second dielectric layer over the barrier layer; after (b), (c) forming a capacitor on the first barrier layer, the capacitor comprising an insulator between first and second metal plates, an extending region of the first plate extending past the insulator and the second plate; after (c), (d) forming a capping layer on the capacitor; after (d), (e) forming a second dielectric layer on the barrier layer and the capping layer; after (e), (f) forming a first patterned photoresist layer over the second dielectric layer; after (g), (h) performing a first reactive ion etch to etch a first trench through the second dielectric layer to the barrier layer over the first wire, a second trench through the second dielectric layer to the capping layer over the extending region of the first plate, and a third trench through the second dielectric layer to the capping layer over the second plate; after (h), (i) removing the first patterned photoresist layer using a plasma; after (i), (j) forming a second patterned photoresist layer over the second dielectric layer; after (j), (k) performing a second reactive ion etch to etch a fourth trench part way through the second dielectric layer over the first and second trenches and to etch a fifth trench part way through the second dielectric layer over the third trench; after (k), (l) performing a third reactive ion etch to extend the first trench though the barrier layer and to extend the second and third trenches through the capping layer; and after (l), (m) removing the second patterned photoresist layer using a reducing plasma or a non-oxidizing plasma.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIGS. 4A through 4D are cross-section drawings illustrating fabrication of dual-damascene wire/contacts to a metal-insulator-metal capacitor according to a fourth embodiment of the present invention; and FIGS. 5A through 5D are cross-section drawings illustrating fabrication of dual-damascene wire/contacts to a metal-insulator-metal capacitor according to a fifth embodiment of the present invention.

DETAILED DESCRIPTION OF THE INVENTION

A damascene process is one in which wire trenches or via openings are formed in a dielectric layer, an electrical conductor of sufficient thickness to fill the trenches is deposited in the trenches and on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene. For the purposes of describing the embodiments of the present invention a contact (sometimes called a stud contact) is defined as a variant type of wire.

A via first dual-damascene process is one in which via openings are formed through the entire thickness of a dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. In both vias first and trench first dual-damascene processes, all via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

Figure 1A:
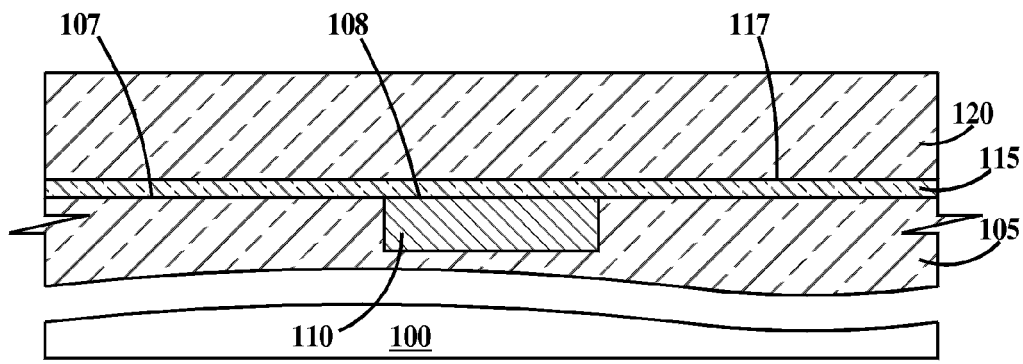
FIGS. 1A through 1F are cross-section drawings illustrating fabrication of a damascene wire/contact according to a first embodiment of the present invention.

FIGS. 1A through 1F are cross-section drawings illustrating fabrication of a damascene wire/contact according to a first embodiment of the present invention. In FIG. 1A, formed on a substrate 100 is a first dielectric layer 105. Formed in first dielectric layer 105 is a metal wire 110. A top surface 107 of first dielectric layer 105 is coplanar with a top surface 108 of wire 110. Formed on respective top surfaces 107 and 108 of first dielectric layer 105 and wire 110 is a dielectric barrier layer 115. Barrier layer 115 may act as an etch stop layer and/or as a copper diffusion barrier. Formed on a top surface 117 of barrier layer 115 is a second dielectric layer 120. First and second dielectric layer 105 and 120 may comprise materials independently selected from the group consisting of porous or nonporous silicon dioxide ($SiO_2$), porous or non-porous fluorinated $SiO_2$ (FSG), a low K (dielectric constant) material, porous or nonporous hydrogen silsesquioxane polymer (HSQ), porous or nonporous methyl silsesquioxane polymer (MSQ), porous or nonporous organosilicate glass (methyl doped silica or $SiO_x(CH_3)_y$ or $SiC_xO_yH_y$ or SiCOH), and porous or nonporous polyphenylene oligomer (e.g., SiLK™ manufactured by Dow Chemical Company of Midland Tex.). A low K dielectric material has a relative permittivity of about 3.6 or less. In one example barrier layer 115 comprises a material selected from the group consisting of silicon nitride ($Si_3N_4$), silicon carbide (SiC), silicon oxy nitride (SiON), silicon oxy carbide (SiOC), silicon carbon nitride (SiCN), and plasma-enhanced silicon nitride ($PSiN_x$). In one example, wire 110 includes copper or tungsten.

Figure 1B:
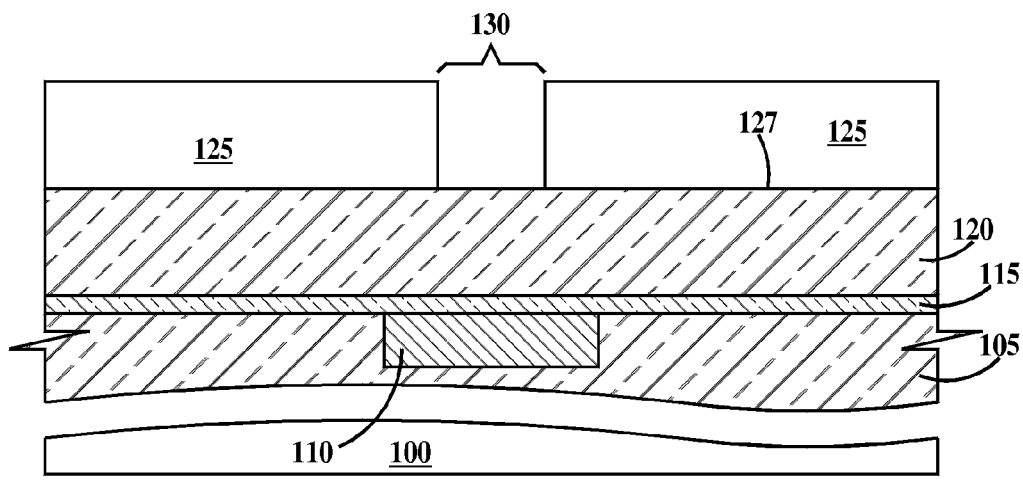

In FIG. 1B, a patterned photoresist layer 125 is formed on a top surface 127 of second dielectric layer 120. Photoresist layer 125 includes an opening 130 entirely through the photoresist layer. Patterned photoresist layer 125 is formed by a photolithographic process. In one example, photoresist layer 125 includes either a bottom antireflective coating (ARC), a top ARC or both a bottom ARC and a top ARC. When a bottom ARC is present, the bottom arc must be removed from the bottom of opening 130 using, for example, an oxygen RIE process, prior to etching of layer 120 (see FIG. 1C).

In a photolithographic process, photoresist layer is applied to a surface, the photoresist layer exposed to actinic radiation (e.g., UV radiation) through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After further processing (e.g., an etch or an ion implantation), the patterned photoresist is removed. The photoresist layer may optionally be baked at one or more of the following steps: prior to exposure to actinic radiation, between exposure to actinic radiation and development, after development.

Figure 1C:
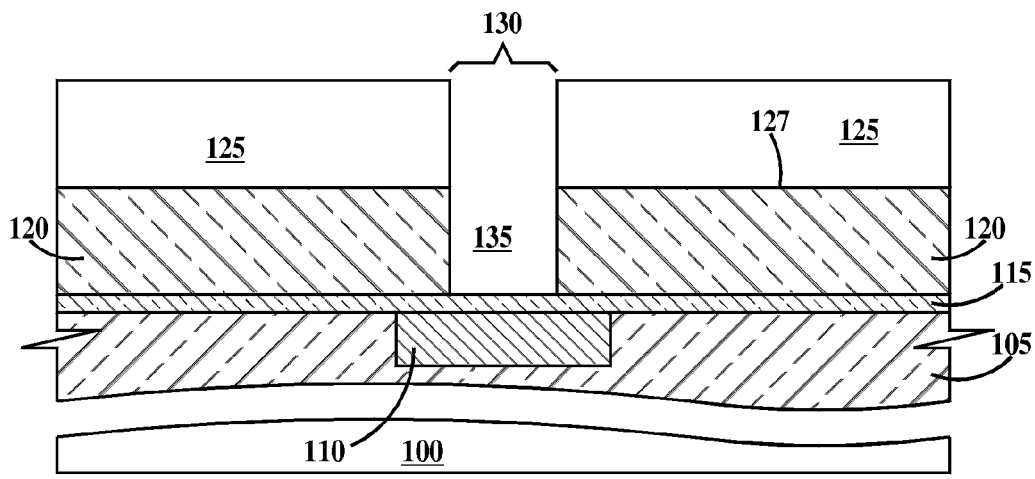

In FIG. 1C, a first reactive ion etch (RIE) process is performed to etch a trench 135 in second dielectric layer 120 in the bottom of opening 130. An RIE process is one in which a plasma is generated from gases introduced into a vacuum system and ions of those gases that have been generated in the plasma are accelerated toward a surface to be etched by electrical fields. It is advantageous that the first RIE process etch second dielectric layer 120 selectively to barrier layer 115 (i.e., not etch barrier layer 115 or etch barrier layer 115 at a very slow rate relative to the etch rate of second dielectric layer 120).

Figure 1D:
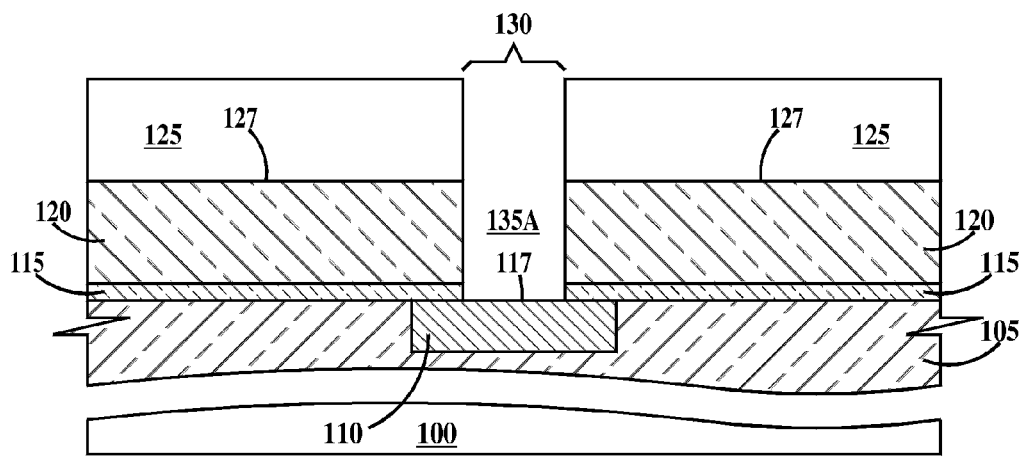

In FIG. 1D, a second RIE etch process is performed to etch through barrier layer 115 in the bottom of trench 135 (see FIG. 1C) to extend trench 135 entirely through barrier layer 115 to form a trench 135A wherein top surface 117 of wire 110 is exposed in trench 135A. It is a critical feature of the first embodiment of the present invention that patterned photoresist layer 125 remain on second dielectric layer 120 and not be removed prior to the second RIE process in order to protect the corners of second dielectric layer 120 proximate to the intersection of trench 135A and top surface 127 of the second dielectric layer during the second RIE process, particularly when the second dielectric layer includes a low K dielectric material. It is advantageous that the second RIE process etch barrier layer 115 selectively to wire 110 (i.e., not etch wire 110 or etch wire 110 at a very slow rate relative to the etch rate of barrier layer 115).

Figure 1E:
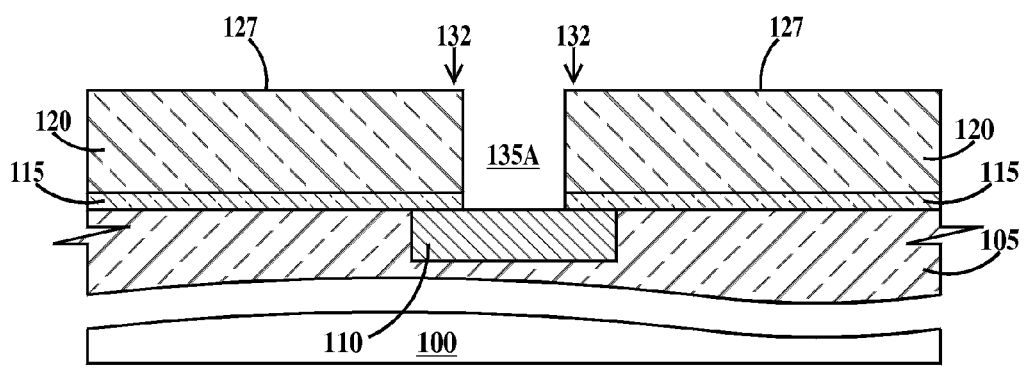

In FIG. 1E, patterned photoresist layer 125 (see FIG. 1D) has been removed using a plasma strip process. It is a critical feature of the first embodiment of the present invention that the plasma strip process be performed using a reducing plasma (e.g., a plasma containing hydrogen containing species) or a non-oxidizing plasma (e.g., a plasma containing, nitrogen and/or argon containing species and not containing oxygen containing species) to prevent damage to wire 110, particularly when wire 110 includes copper or tungsten. Note, top surface 127 of second dielectric layer 120 was protected by patterned photoresist layer 125 (see FIG. 1D) during the etching of barrier layer 115. If patterned photoresist layer 125 (see FIG. 1D) is removed prior to etching barrier layer 115, the corners 132 will be eroded by the barrier etch process resulting in an increase in the width of trench 135A at top surface 127. The damascene wire (see FIG. 1F and description infra) formed in trench 135A will be larger than designed and could result in reliability and/or yield degradation.

Figure 1F:
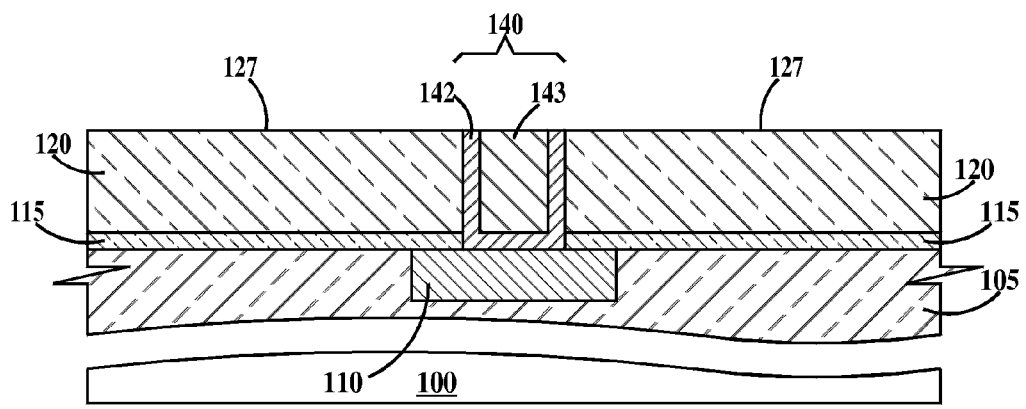

In FIG. 1F, a damascene wire 140 including an electrically conductive liner 142 and an electrically conductive core conductor 143 has been formed to fill trench 135A (see FIG. 1E). Damascene wire 140 is formed by (1) depositing liner 143 on the bottom and sidewalls of trench 135A (see FIG. 1E) and top surfaces 127 of second dielectric layer 120, (2) depositing core conductor 163 (e.g., tungsten) or electroplating core conductor 163 (e.g., copper) to overfill remaining space in trench 135A, and (3) performing a CMP to remove excess liner 142 and core conductor 143 so a top surface of wire 140 is essentially coplanar with top surface 127 of second dielectric layer 120. In one example, liner 142 comprises layers of tantalum and tantalum nitride or layers of titanium and titanium nitride. In one example, core conductor 143 comprises copper or tungsten.

FIGS. 2A through 2E are cross-section drawings illustrating later steps in the fabrication of a dual-damascene wire/contact according to a second embodiment of the present invention. The steps illustrated in FIGS. 1A, 1B and 1C and described supra are performed prior to the steps illustrated in FIG. 2A and described infra. The processes illustrated in the sequence of FIGS. 1A, 1B, 1C, 2A, 2B, 2C, 2D and 2E illustrate a via first dual-damascene process.

Figure 2A:
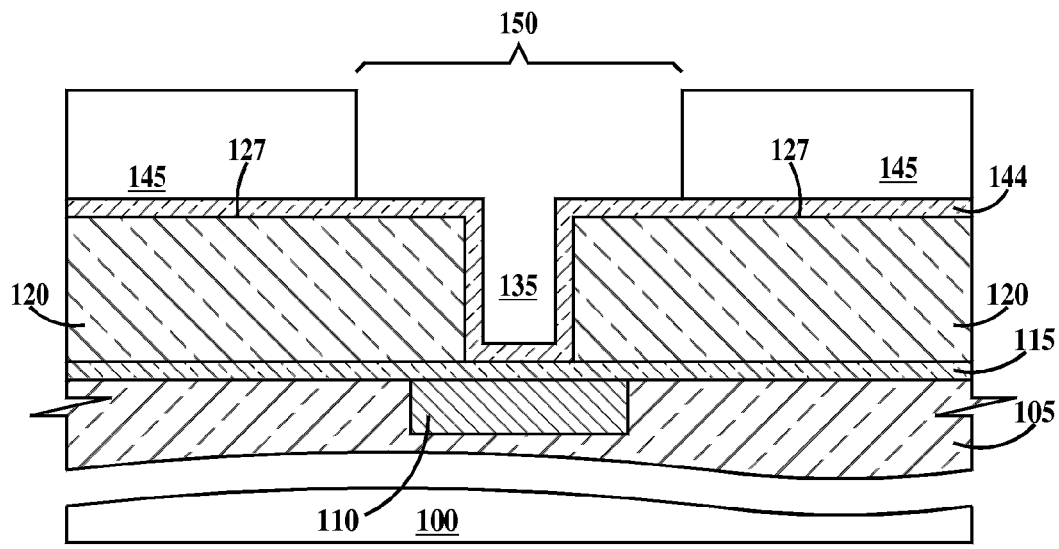
FIGS. 2A through 2E are cross-section drawings illustrating later steps in the fabrication of a dual-damascene wire/contact according to a second embodiment of the present invention.

In FIG. 2A, a first plasma strip process to remove photoresist layer 125 (see FIG. 1C) is performed, then an optional bottom ARC 144 is formed on top surface 127 of second dielectric layer 120 and sidewalls and the bottom of trench 135. In a first example (as shown in FIG. 2A), bottom ARC layer 144 is a conformal ARC which coats the bottom and sidewalls of trench 135. In a second example, bottom ARC 144 may be a non-conformal ARC. Bottom ARC 144 my be formed by spin-application or deposition. Then a photoresist layer 145 is formed on bottom ARC 144 and an opening 150 photolithographically formed in photoresist layer 145. Bottom ARC 144 coated regions of top surface 127 of dielectric layer 120 proximate to trench 135 and trench 135 are exposed in the bottom of opening 150.

Figure 2B:
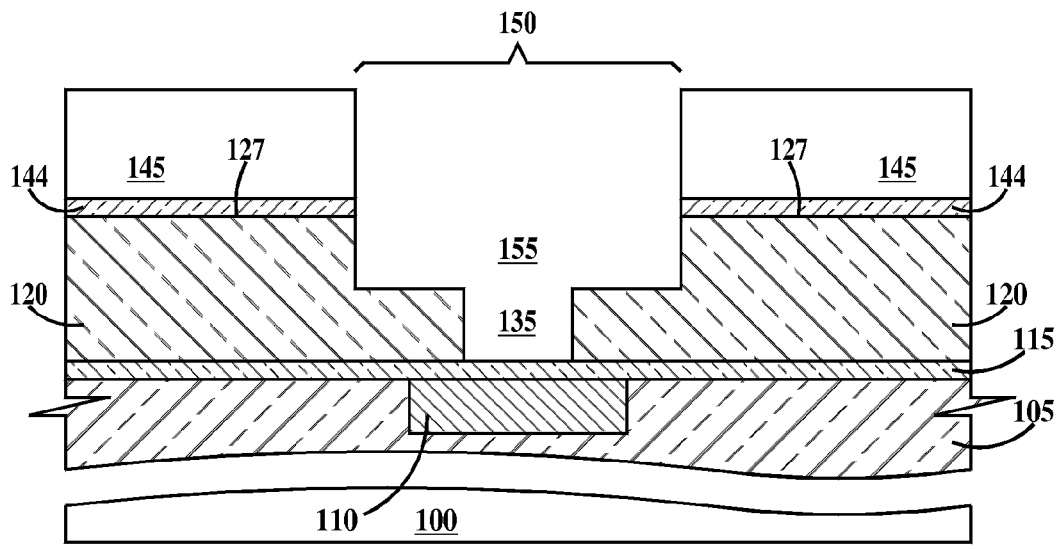

In FIG. 2B, a second RIE process is performed to etch a trench 155 part way through second dielectric layer 120 in the bottom of opening 150. Remaining regions of trench 135 and trench 155 are open to each other. A perimeter of trench 135 is aligned within a perimeter of trench 155. During the RIE, a regions of bottom ARC 144 not protected by photoresist layer 145 is also removed by the RIE. The presence of bottom ARC 144 reduces the need for the materials of barrier layer 115 to etch at a significantly slower rate than the material of dielectric layer 120. When no bottom ARC is used, it is advantageous that the material of dielectric layer 120 etch selectively to the material of barrier layer 115 (i.e., not etch the material of barrier layer 115 or etch the material of barrier layer at a very slow rate relative to the etch rate of the material of the dielectric layer 120).

While FIG. 2B shows no bottom ARC remaining in the bottom of trench 135, it is advantageous to have some bottom ARC 144 (when a bottom ARC is used) remaining in the bottom of trench 135 thereby eliminating the need that the material of dielectric layer 120 to etch selectively to the materials of barrier layer 115. When there is bottom ARC remaining in the bottom of trench 135 is may be removed using, for example, an oxygen RIE or wet strip process.

Figure 2C:
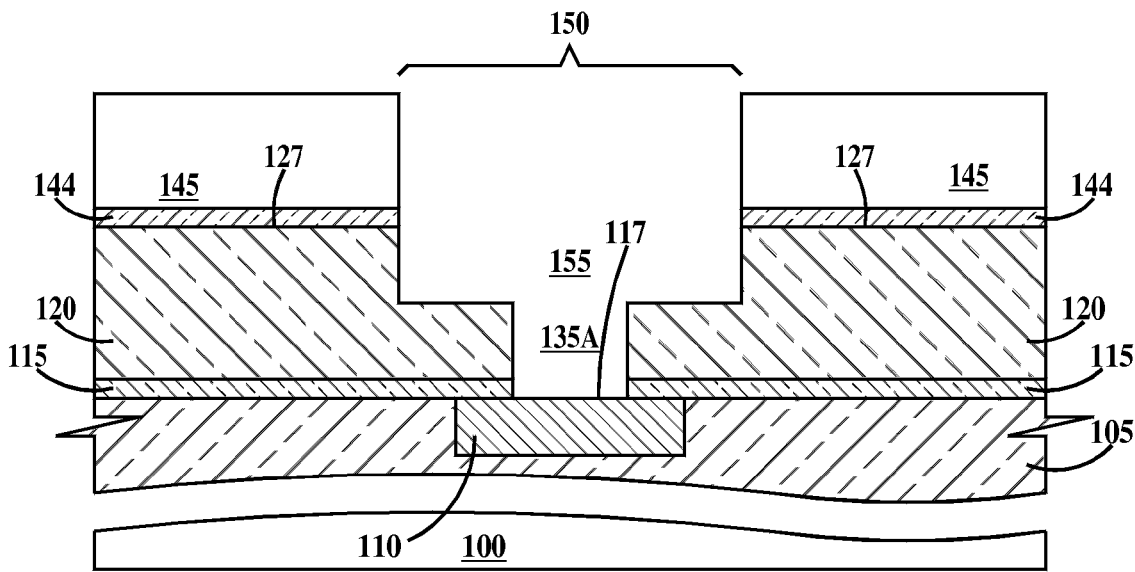

In FIG. 2C, a third RIE etch process is performed to etch through barrier layer 115 in the bottom of trench 135 (see FIG. 1C) to extend trench 135 entirely through barrier layer 115 to form a trench 135A wherein a top surface 117 of wire 110 is exposed in trench 135A. It is a critical feature of the second embodiment of the present invention that patterned second photoresist layer 145 remain on second dielectric layer 120 and not be removed prior to the second and third RIE processes in order to protect the corners of second dielectric layer 120 proximate to the intersection of trench 135A and top surface 127 of the second dielectric layer during the second and third RIE processes, particularly when the second dielectric layer includes a low K dielectric material. It is advantageous that the third RIE process etch barrier layer 115 selectively to wire 110 (i.e., not etch wire 110 or etch wire 110 at a very slow rate relative to the etch rate of barrier layer 115).

Figure 2D:
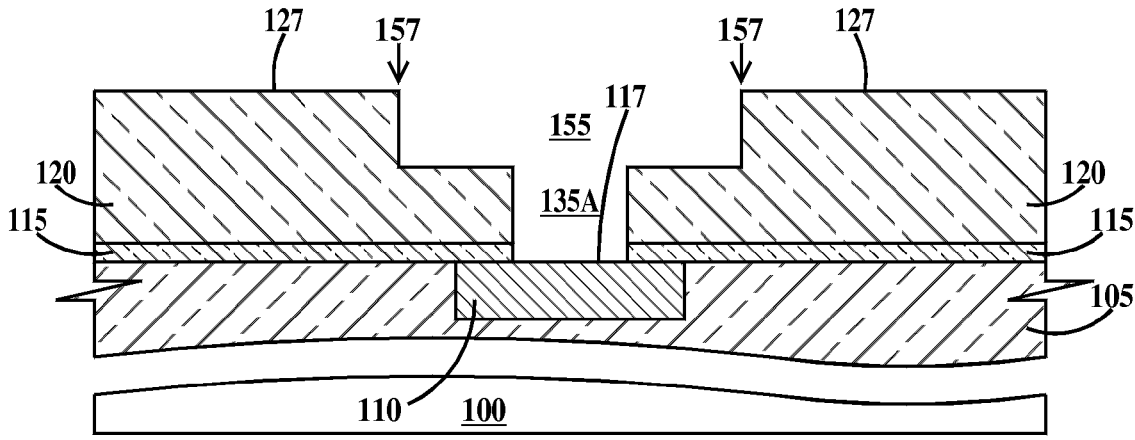

In FIG. 2D, patterned second photoresist layer 145 and any remaining bottom ARC 144 (see FIG. 2C) is removed using a second plasma strip process. It is a critical feature of the second embodiment of the present invention that the second plasma strip process be performed using a reducing plasma (e.g., a plasma containing hydrogen containing species) or a non-oxidizing plasma (e.g., a plasma containing, nitrogen and/or argon containing species and not containing oxygen containing species) to prevent damage to wire 110, particularly when wire 110 includes copper or tungsten or tungsten. If photoresist layer 145 (see FIG. 1D) is removed prior to etching barrier layer 115, corners 157 may be eroded by the barrier etch process resulting in an increase in the width of trench 155 at top surface 127. The dual-damascene wire (see FIG. 2E and description infra) formed in trenches 135A and 155 will be larger than designed and could result in reliability and/or yield degradation.

Figure 2E:
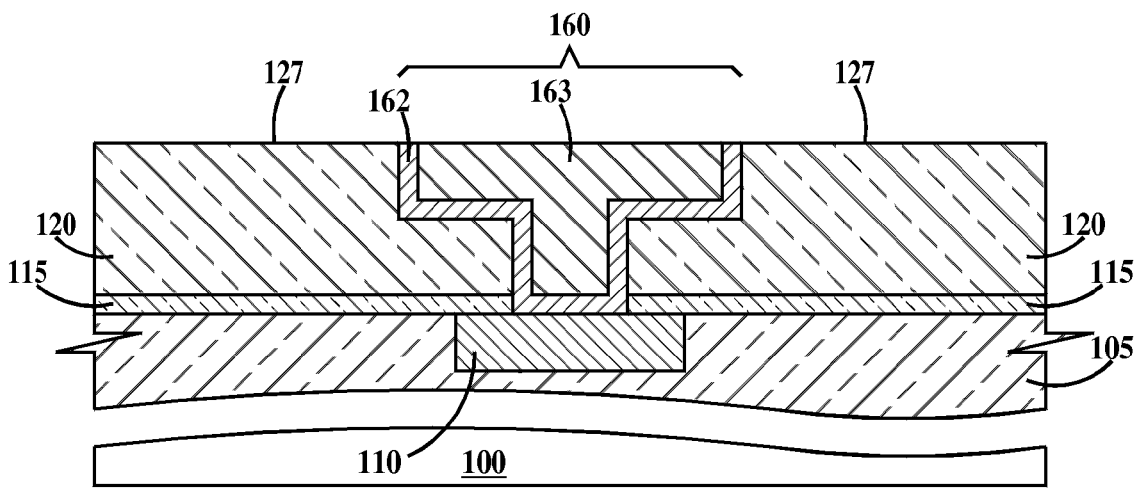

In FIG. 2E, a dual-damascene wire 160 including an electrically conductive liner 162 and an electrically conductive core conductor 163 has been formed to fill trenches 135A and 155 (see FIG. 2D). Damascene wire 160 is formed by (1) depositing liner 162 on the bottom and sidewalls of trench 135A/155 (see FIG. 2D) and top surfaces 127 of second dielectric layer 120, (2) depositing core conductor 163 (e.g., tungsten) or electroplating core conductor 163 (e.g., copper) to overfill remaining space in trench 135A/155, and (3) performing a CMP to remove excess liner 162 and core conductor 163 so a top surface of wire 160 is essentially coplanar with top surface 127 of second dielectric layer 120. In one example, liner 162 comprises layers of tantalum and tantalum nitride or layers of titanium and titanium nitride. In one example, core conductor 163 comprises copper.

It should be understood that in a alternative methodology of the second embodiment of the present invention, a trench first dual-damascene process, trench 155 (see FIG. 2B) is formed in a first lithographic/first RIE process and afterwards trench 135 (see FIG. 2B) is formed in a second lithographic/RIE process followed by formation of trench 135A in a third RIE process (with the photoresist layer of the second lithographic process in place) followed by removal of the second photoresist layer using a reducing plasma or a non-oxidizing plasma as described supra in reference to FIG. 2D followed by formation of wire 160 as illustrated in FIG. 2E.

Figure 3A:
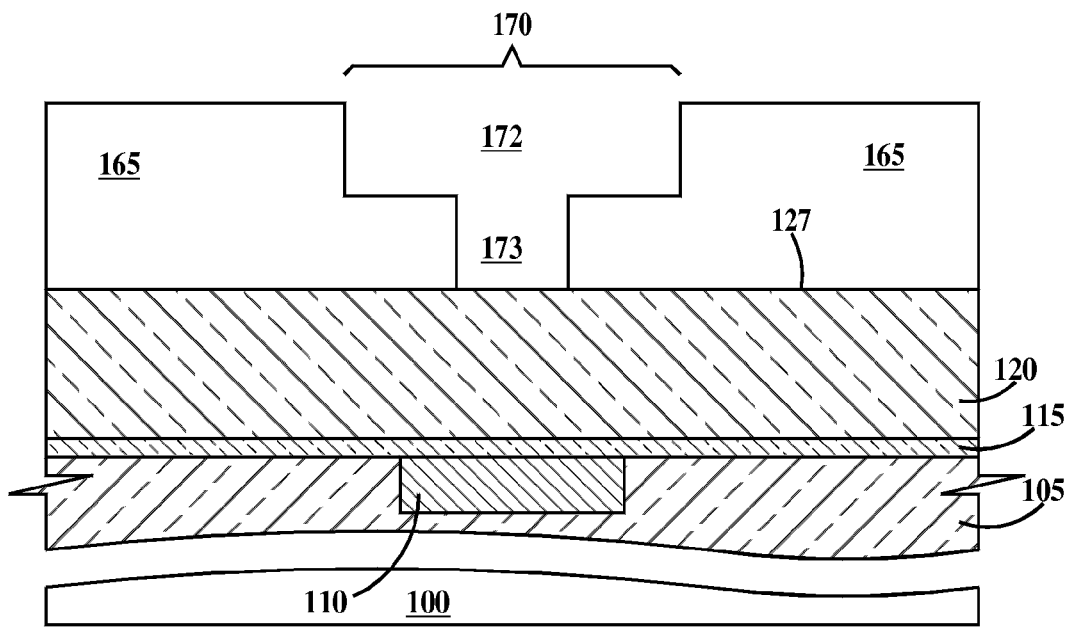
FIGS. 3A and 3B are cross-section drawings illustrating later steps in the fabrication of a dual-damascene wire/contact according to a third embodiment of the present invention.
Figure 3B:
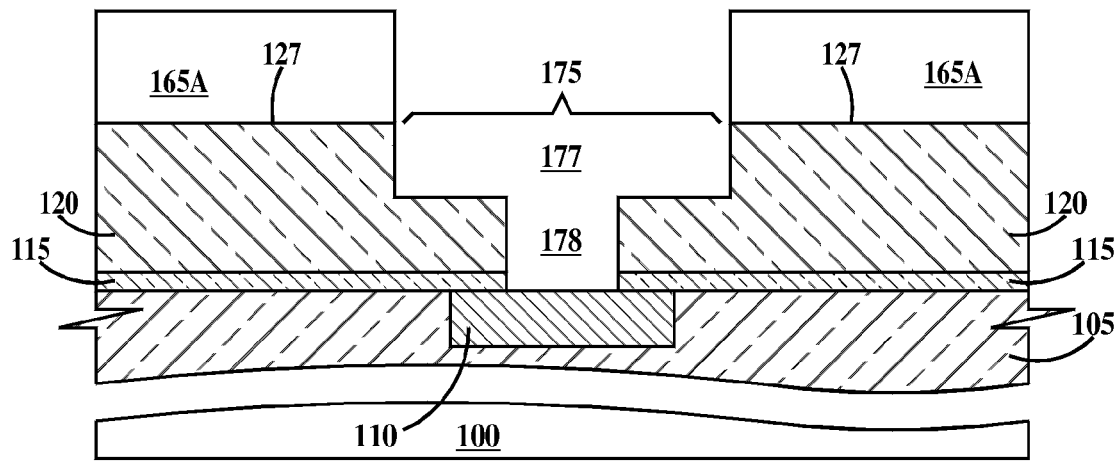

FIGS. 3A and 3B are cross-section drawings illustrating later steps in the fabrication of a dual-damascene wire/contact according to a third embodiment of the present invention. The step illustrated in FIG. 1A and described supra is performed prior to the steps illustrated in FIG. 3A and described infra.

In FIG. 3A, a patterned photoresist layer 165 is formed on top surface 127 of second dielectric layer 120. Patterned photoresist layer 165 includes an opening 170 having an upper region 172 and a lower region 173 with top surface 127 of dielectric layer 120 exposed in the bottom of lower region 173. In one example, patterned photoresist layer 165 is formed by photolithographic process called "gray scaling" wherein a photomask includes an image having first and second regions transmissive to actinic radiation surrounded by regions opaque actinic radiation. The first region (corresponding to region 173 of opening 170) has a higher transmission of actinic radiation than the second region (corresponding to region 173 of opening 170).

In FIG. 3B, a first RIE process is performed to transfer the shape of opening 170 of FIG. 3A into a trench 175 having a first region 177 and a second region 178 in second dielectric layer 120. During the first RIE process photoresist layer 165 (see FIG. 3A) is eroded to form a photoresist layer 165A. A perimeter of second region 178 is aligned within a perimeter of first region 177. After the first RIE, photoresist layer 165A (of photoresist layer 165 of FIG. 3A) remains as well as all or some (in an unbroken layer) of barrier layer 115. Next a second RIE etch process is performed to etch through exposed regions of barrier layer 115 to expose top surface 117 of wire 110 in the bottom of second region 178. After the second RIE is complete, remaining patterned photoresist layer 165A is removed using a plasma strip process. It is a critical feature of the third embodiment of the present invention that patterned photoresist layer 165A remain on second dielectric layer 120 and not be removed prior to the second RIE process in order to protect the corners of second dielectric layer 120 proximate to the intersection of first region of trench 175 and top surface 127 of the second dielectric layer during the second RIE process, particularly when the second dielectric layer includes a low K dielectric material. It is advantageous that the first RIE process etch second dielectric layer 120 selectively to barrier layer 115 (i.e., not etch barrier layer 115 or etch barrier layer 115 at a very slow rate relative to the etch rate of second dielectric layer 120). It is advantageous that the second RIE process etch barrier layer 115 selectively to wire 110 (i.e., not etch wire 110 or etch wire 110 at a very slow rate relative to the etch rate of barrier layer 115).

Next, the processes described supra in reference to FIGS. 2D and 2E are performed to complete the description of the second embodiment of the present invention. It is a critical feature of the third embodiment of the present invention that the plasma strip process be performed using a reducing plasma (e.g., a plasma containing hydrogen containing species) or a non-oxidizing plasma (e.g., a plasma containing, nitrogen and/or argon containing species and not containing oxygen containing species) to prevent damage to wire 110, particularly when wire 110 includes copper or tungsten.

FIGS. 4A through 4D are cross-section drawings illustrating fabrication of dual-damascene wire/contacts to a metal-insulator-metal capacitor according to a fourth embodiment of the present invention. The processes illustrated in the sequence of FIGS. 4A, 4B, 4C and 4D illustrate a via first dual-damascene process.

In FIG. 4A, formed on a substrate 200 is a first dielectric layer 205. Formed in first dielectric layer 205 is a metal wire 210. Formed on respective top surfaces of first dielectric layer 205 and wire 210 is a dielectric barrier layer 215. Barrier layer 215 may act as an etch stop layer and/or as a copper diffusion barrier.

Formed on a region of the top surface of barrier layer 215 is an exemplary metal-insulator-metal (MIM) capacitor 245. A charge storage region of MIM capacitor 245 comprises (in sequence from barrier layer 215 upward): an optional insulating layer 220, a first plate 225, a MIM dielectric layer 225, a second plate 240 and a capping layer 230. A first plate contact region of MIM capacitor 245 comprises (in sequence from barrier layer 215 upward): insulating layer 220, an extending region of first plate 225 and capping layer 230. MIM capacitor 245 may be formed by: (1) depositing insulating layer 220; (2) depositing a first metal layer (that will become first plate 225); (3) depositing MIM dielectric layer 225; (4) depositing a second metal layer (that will become second plate 225); (5) patterning the second metal layer and MIM dielectric layer 235 to form an extending region of the first metal layer; (6) depositing capping layer 230; and (7) patterning capping layer 230, the second metal layer, MIM dielectric layer 225, the second metal layer and insulating layer 220 to define the lateral extents of MIM capacitor 245.

Formed on exposed surfaces of barrier layer 215 and MIM capacitor 245 is a second dielectric layer 250. Then a patterned first photoresist layer 255 is formed on the top of second dielectric layer 250. Patterned first photoresist layer 255 is formed by a photolithographic process.

Materials for first dielectric layer 205, wire 210, barrier layer 215 and second dielectric layer 250 are the same, respectively as for lower dielectric layer 105, wire 110, barrier layer 115 and second dielectric layer 120 of FIG. 1A as described supra. Materials for capping layer 230 are the same as for barrier layer 215. In one example, barrier layer 215 and capping layer 230 comprise the same material. In one example first and second plates 225 and 240 comprise titanium and/or titanium nitride.

In FIG. 4B, a first RIE process is performed to etch trench 260A over wire 210 and trenches 260B, 260C and 260D over MIM capacitor 245 through second dielectric layer 250. It is advantageous that the first RIE process etch second dielectric layer 250 selectively to barrier layer 215 and capping layer 230 (i.e., not etch barrier layer 215/capping layer 230 or etch barrier layer 215/capping layer 230 at a very slow rate relative to the etch rate of second dielectric layer 220). After the first RIE, patterned first photoresist layer 255 (see FIG. 4A) is removed in a first plasma strip process. The first plasma strip process may contain an oxygen containing species as wire 210 is still protected by barrier layer 215 and upper and lower MIM plates 225 and 240 are still protected by capping layer 230.

In FIG. 4C, a patterned second photoresist layer 265 is formed on the top surface of second dielectric layer 250. Second patterned photoresist layer 265 is formed by a photolithographic process. A second RIE process is performed to etch trenches 270A and 270B part way through second dielectric layer 250. Remaining regions of trench 260A and trench 270A are open to each other. Remaining regions of trench 260B and trench 270A are open to each other. Remaining regions of trench 260C and trench 270B are open to each other. Remaining regions of trench 260D and trench 270B are open to each other. Perimeters of trenches 260A and 260B are aligned within a perimeter of trench 270A. Perimeters of trenches 260C and 260D are aligned within a perimeter of trench 270B. It is advantageous that the second RIE process etch second dielectric layer 250 selectively to barrier layer 215 and capping layer 230 (i.e., not etch barrier layer 215/capping layer 230 or etch barrier layer 215/capping layer 230 at a very slow rate relative to the etch rate of second dielectric layer 220).

Next, a third RIE etch process is performed to etch through exposed regions of barrier layer 215 in the bottom of trench 260A to expose a region of wire 210, to etch through capping layer 230 in the bottom of trench 260B to expose a region of lower MIM plate 225 and to etch through capping layer 230 in tee bottom of trenches 260C and 360D to exposed regions of second plate 255 bottoms of trenches 260C and 260D. It is a critical feature of the fourth embodiment of the present invention that second patterned photoresist layer 265 remain on second dielectric layer 220 and not be removed prior to the second and third RIE processes in order to protect the corners of second dielectric layer 220 proximate to the intersection of trenches 270A and 270B and the top surface of the second dielectric layer during the second and third RIE processes, particularly when the second dielectric layer includes a low K dielectric material.

In FIG. 4D, patterned second photoresist layer 265 (see FIG. 4C) has been removed using a second plasma strip process. It is a critical feature of the second embodiment of the present invention that the second plasma strip process be performed using a reducing plasma (e.g., a plasma containing hydrogen containing species) or a non-oxidizing plasma (e.g., a plasma containing, nitrogen and/or argon containing species and not containing oxygen containing species) to prevent damage to wire 210 and first and second plates 225 and 240, particularly when wire 210 includes copper and/or first and second plates 225 and 240 include titanium or titanium nitride. Next, a dual-damascene wire 275A including an electrically conductive liner 280A and an electrically conductive core conductor 285A is formed in trenches 270A, 260A and 260B (see FIG. 4C) and a dual-damascene wire 275B including an electrically conductive liner 280B and an electrically conductive core conductor 285B is formed in trenches 270B, 260C and 260D (see FIG. 4C). Dual-damascene wires 275A and 275B are formed by (1) depositing liner 280A/B on the bottom and sidewalls of trenches 260A/260B/270A and 260C/260D/270B (see FIG. 4C) and the top surface of second dielectric layer 250, (2) electroplating a metal (e.g., copper) to overfill remaining space in trenches 260A/260B/270A and 260C/260D/270B, and (3) performing a CMP to remove excess liner 280A/280B and core conductor 285A/285B so top surfaces of wire 275A and 27B and the top surface of second dielectric layer 250 are essentially coplanar. In one example, liners 280A and 280B comprise layers of tantalum and tantalum nitride or layers of titanium and titanium nitride. In one example, core conductors 285A and 285B comprises copper.

It should be understood that in a alternative methodology of the fourth embodiment of the present invention, a trench first dual-damascene process, trenches 270A and 270B (see FIG. 4C) are formed in a first lithographic/first RIE process and afterwards trenches 260A, 260B, 260C and 260D (see FIG. 4C) are formed in a second lithographic/RIE process followed by formation barrier layer 215/capping layer 230 etching in a third RIE process (with the photoresist layer of the second lithographic process in place) followed by removal of the second photoresist layer in an oxygen free plasma strip process followed by formation of wires 275A and 275B as illustrated in FIG. 4D.

Figures 5C, 5D:
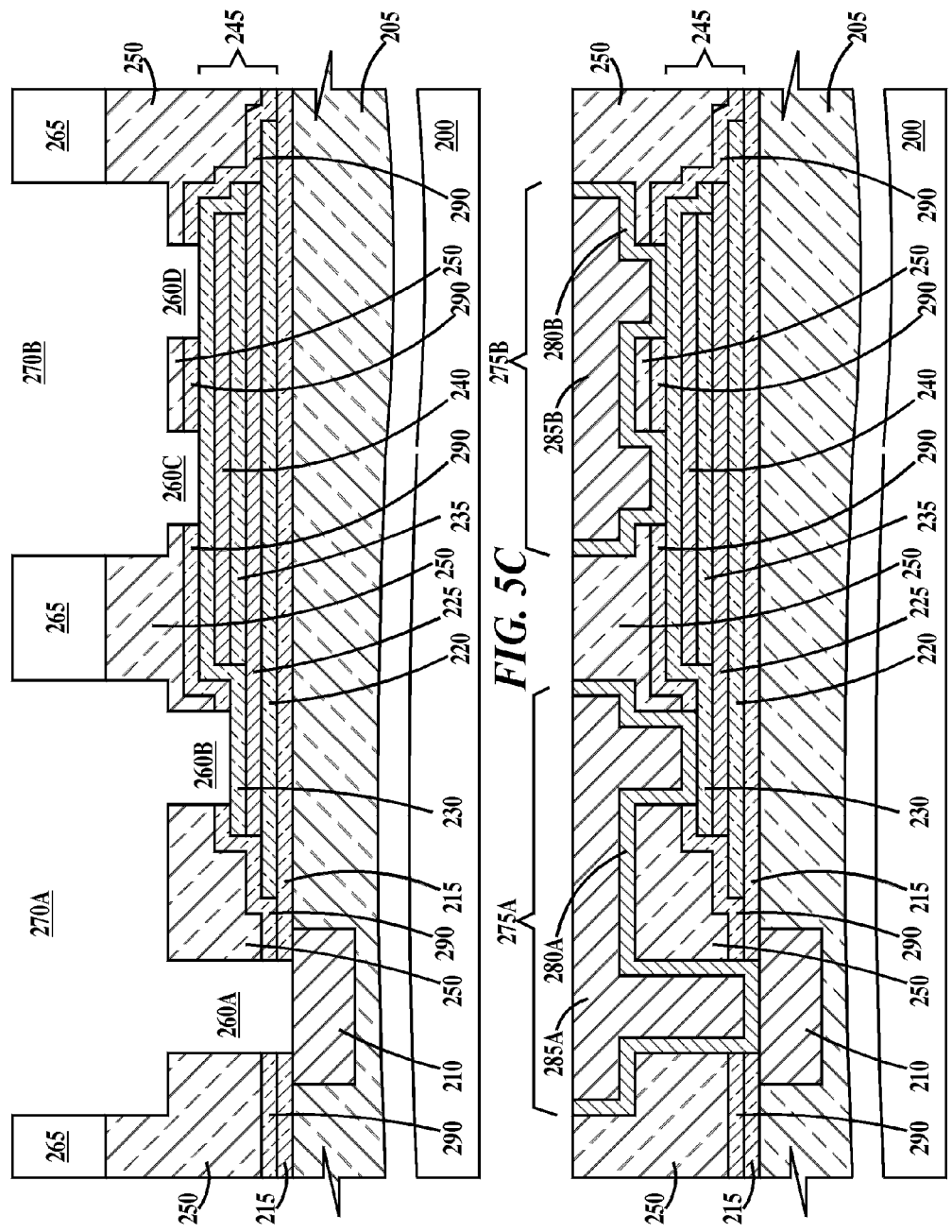

FIGS. 5A through 5D are cross-section drawings illustrating fabrication of dual-damascene wire/contacts to a metal-insulator-metal capacitor according to a fifth embodiment of the present invention. The processes illustrated in the sequence of FIGS. 5A, 5B, 5C and 5D illustrate a via first dual-damascene process. The fifth embodiment of the present invention is similar to the fourth embodiment of the present invention except that an etch stop layer 290 has be formed those regions of barrier layer 215 not under MIM capacitor 245 and over MIM capacitor 245 (see FIG. 5A). In one example etch stop layer comprises silicon dioxide. Turning to FIG. 5B, the first RIE etch includes a first step that etches second dielectric layer selectively to etch stop layer 290 and a second step that etches etch stop layer selectively to barrier layer 215 and capping layer 230. Except for the presence etch stop layer 290, FIGS. 5C and 5D are similar to FIGS. 4C and 4D respectfully.

It should be understood that in a alternative methodology of the fifth embodiment of the present invention, a trench first dual-damascene process, trenches 270A and 270B (see FIG. 5C) are formed in a first lithographic/first RIE process and afterwards trenches 260A, 260B, 260C and 260D (see FIG. 5C) are formed in a second lithographic/RIE process followed by formation barrier layer 215/capping layer 230 etching in a third RIE process (with the photoresist layer of the second lithographic process in place) followed by removal of the second photoresist layer in an oxygen free plasma strip process followed by formation of wires 275A and 275B as illustrated in FIG. 5D.

Thus the embodiments of the present invention provide damascene and dual-damascene fabrication methodologies with no ILD corner erosion and reduced damage to undying layers exposed during fabrication of damascene and dual-damascene wires and contacts.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) forming a wire in a first dielectric layer on a substrate;
   after (a), (b) forming a dielectric barrier layer over said wire and said first dielectric layer;
   after (b), (c) forming a second dielectric layer over said barrier layer;
   after (c), (d) forming a patterned photoresist layer on a top surface of said second dielectric layer;
   after (d), (e) with said patterned photoresist layer in place, performing a first reactive ion etch to etch a trench through said second dielectric layer and not through said barrier layer;
   after (e), (f) with said patterned photoresist layer in place, performing a second reactive ion etch to extend said trench through said barrier layer; and
   after (f), (g) removing said patterned photoresist layer using a reducing plasma or a non-oxidizing plasma.

2. The method of claim 1, further including:
   filling said trench with an electrical conductor.

3. The method of claim 2, wherein said electrical conductor comprises copper or tungsten.

4. The method of claim 1, further including:
   forming an electrically conductive liner on (i) all surfaces of said barrier layer, said second dielectric layer, and said first wire that are exposed in said trench and (ii) on a top surface of said second dielectric layer;
   filling remaining space in said trench with an electrically conductive core conductor; and
   performing a chemical mechanical polish to form a damascene wire by removing excess liner and core conductor so a top surface of said damascene wire is coplanar with said top surface of said second dielectric layer.

5. The method of claim 1, wherein:
   said first and second dielectric layers independently include a material selected from the group consisting of porous or nonporous silicon dioxide ($SiO_2$), porous or nonporous fluorinated $SiO_2$ (FSG), a low K (dielectric constant) material, porous or nonporous hydrogen silsesquioxane polymer (HSQ), porous or nonporous methyl silsesquioxane polymer (MSQ), porous or nonporous organosilicate glass (methyl doped silica or $SiO_x(CH_3)_y$, or $SiC_xO_yH_y$, or SiCOH), and porous or nonporous polyphenylene oligomer; and
   said barrier layer includes a material selected from the group consisting of silicon nitride ($Si_3N_4$), silicon carbide (SiC), silicon oxy nitride (SiON), silicon oxy carbide (SiOC), silicon carbon nitride (SiCN), and plasma-enhanced silicon nitride ($PSiN_x$).

6. The method of claim 1, further including:
   filling said trench with an electrically conductive material to form a damascene wire;
   wherein an opening in said patterned photoresist layer includes an upper region extending part way through said patterned photoresist layer and lower regions extending completely through said patterned photoresist layer; and
   wherein said trench includes an upper region extending part way through said second dielectric layer and a lower region extending the rest of the way through said second dielectric layer.

7. The method of claim 1, wherein said first reactive ion etch etches said second dielectric layer selectively to said barrier layer.

8. The method of claim 7, wherein said second reactive ion etch etches said second barrier layer selectively to said wire.

9. A method, comprising:
(a) forming a wire in a first dielectric layer on a substrate;
after (a), (b) forming a dielectric barrier layer over said wire and said first dielectric layer;
after (b), (c) forming a second dielectric layer over said barrier layer;
after (c), (d) forming an antireflective coating on a top surface of said second dielectric layer and forming a patterned photoresist layer on a top surface of said antireflective coating;
after (d), (e) with said patterned photoresist layer in place, removing said antireflective coating where said antireflective coating is not protected by said patterned photoresist layer and then performing a first reactive ion etch to etch a trench through said second dielectric layer and not through said barrier layer;
after (e), (f) with said patterned photoresist layer in place, performing a second reactive ion etch to extend said trench through said barrier layer; and
after (f), (g) removing said patterned photoresist layer and any remaining anti-reflective coating using a reducing plasma or a non-oxidizing plasma.

10. The method of claim 9, further including:
filling said trench with an electrical conductor.

11. The method of claim 10, wherein said electrical conductor comprises copper or tungsten.

12. The method of claim 9, further including:
forming an electrically conductive liner on (i) all surfaces of said barrier layer, said second dielectric layer, and said first wire that are exposed in said trench and (ii) on a top surface of said second dielectric layer;
filling remaining space in said trench with an electrically conductive core conductor; and
performing a chemical mechanical polish to form a damascene wire by removing excess liner and core conductor so a top surface of said damascene wire is coplanar with said top surface of said second dielectric layer.

13. The method of claim 9, wherein:
said first and second dielectric layers independently include a material selected from the group consisting of porous or nonporous silicon dioxide ($SiO_2$), porous or nonporous fluorinated $SiO_2$ (FSG), a low K (dielectric constant) material, porous or nonporous hydrogen silsesquioxane polymer (HSQ), porous or nonporous methyl silsesquioxane polymer (MSQ), porous or nonporous organosilicate glass (methyl doped silica or $SiO_x(CH_3)_y$, or $SiC_xO_yH_y$, or SiCOH), and porous or nonporous polyphenylene oligomer; and
said barrier layer includes a material selected from the group consisting of silicon nitride ($Si_3N_4$), silicon carbide (SiC), silicon oxy nitride (SiON), silicon oxy carbide (SiOC), silicon carbon nitride (SiCN), and plasma-enhanced silicon nitride ($PSiN_x$).

14. The method of claim 9, further including:
filling said trench with an electrically conductive material to form a damascene wire;
wherein an opening in said patterned photoresist layer includes an upper region extending part way through said patterned photoresist layer and lower regions extending completely through said patterned photoresist layer; and
wherein said trench includes an upper region extending part way through said second dielectric layer and a lower region extending the rest of the way through said second dielectric layer.

15. The method of claim 9, wherein said removing said antireflective coating where said antireflective coating is not protected by said patterned photoresist layer is performed using an oxygen RIE process.

16. The method of claim 9, wherein said first reactive ion etch etches said second dielectric layer selectively to said barrier layer.

17. The method of claim 9, wherein said second reactive ion etch etches said second barrier layer selectively to said wire.

* * * * *